US006720715B1

(12) United States Patent
Bicz

(10) Patent No.: US 6,720,715 B1
(45) Date of Patent: Apr. 13, 2004

(54) IMPULSE SOUND TRANSDUCER WITH AN ELEMENTARY BLOCK MADE OF PIEZOELECTRIC MATERIAL

(75) Inventor: Wieslaw Bicz, Wroclaw (PL)

(73) Assignee: Sonident Anstalt, Vaduz (LI)

( * ) Notice: Subject to any disclaimer, the term of this patent is extended or adjusted under 35 U.S.C. 154(b) by 0 days.

(21) Appl. No.: 10/070,351

(22) PCT Filed: Apr. 18, 2000

(86) PCT No.: PCT/EP00/03489

§ 371 (c)(1), (2), (4) Date: Oct. 19, 2001

(87) PCT Pub. No.: WO00/62946

PCT Pub. Date: Oct. 26, 2000

(30) Foreign Application Priority Data

Apr. 19, 1999 (DE) .......................................... 199 17 429

(51) Int. Cl.[7] ................................................ H01L 41/08

(52) U.S. Cl. ........................................ 310/367; 310/334

(58) Field of Search .................................. 310/334, 367

(56) References Cited

U.S. PATENT DOCUMENTS 3,271,704 A * 9/1966 Fitch .......................... 333/145
3,891,869 A * 6/1975 Scarpa ....................... 310/325
3,899,698 A * 8/1975 Kleinschmidt .............. 310/328
4,864,178 A * 9/1989 Bjurling et al. ............. 310/334
5,606,297 A * 2/1997 Phillips ...................... 333/141
2003/0085637 A1 * 5/2003 Brechbuhl et al. .......... 310/367

FOREIGN PATENT DOCUMENTS

WO WO97/16260 * 5/1997 ............. B06B/1/06

* cited by examiner

*Primary Examiner*—Thomas M. Dougherty
(74) *Attorney, Agent, or Firm*—Herbert Dubno

(57) ABSTRACT

The invention relates to an impulse sound traducer for the ultrasonic range. Transducers in prior art require complicated and expensive technology in order to really generate good impulses. The invention aims at providing a sound transducer for the ultrasonic range, which transmits strong and short impulses, has high senstivity and ensures repeatability of parameters. This is achieved by a sound transducer for the ultrasonic range that is used both as a transmitter and as a receiver and is comprised of an elementary block made of piezoelectric material, wherein the height of the elementary blocks consisting of piezoelectric material is bigger than its width and the block on the output end of the impulse has a formed edge so that the elementary block has a T-shape in the longitudinal section, wherein one electrode is provided on the outlet surface while the other electrode extends above the edge on the block.

1 Claim, 2 Drawing Sheets

IMPULSE SOUND TRANSDUCER WITH AN ELEMENTARY BLOCK MADE OF PIEZOELECTRIC MATERIAL

CROSS REFERENCE TO RELATED APPLICATIONS

This application in a national stage of PCT/EP00/03489 filed Apr. 18, 2000 and is based upon German national application 199 17 429.6 of Apr. 19, 1999 under the International Convention.

FIELD OF THE INVENTION

The invention relates to a pulse-sound transducer in the ultrasonic range. Such transducers are necessary in various fields technology in which short pulses are necessary. As a first case there is defectoscopy which includes sonography in the field of medicine.

BACKGROUND OF THE INVENTION

The classical construction of such a transducer comprises a plane parallel plate of piezoelectric material which has on the two broad upper and lower sides respective electrodes whereby the plate can be polarized perpendicularly to the sides which are covered with electrodes. This plate is cemented to a block which damps the ultrasonic waves and has an acoustic impedance which is matched to the piezo plate. On the output side so-called matching layers are provided which afford reflection-free sound transfer and with pulse operation can produce very short sound pulses. Transducers of this type belong to the known state of the art and a good discussion thereof and the problems arising therewith, for example can be found in the book of M. G. Silk, Ultrasonic Transducers for Nondestructive Testing, Adam Hilger 1984.

Transducers of the known type of construction require expensive technology and thus are costly where they are required to generate good pulses effectively. Furthermore, the known transducers are relatively thick (at least 5 mm) and it is thus practically impossible to fabricate them for frequencies greater than 30 MHz. In addition, with pulsed excitation, only relatively long pulses can be generated which have drawbacks for measurement purposes. A further disadvantage is that they are not suitable for automatic mass production and also in that their parameters cannot be maintained within a narrow tolerance range.

Relatively good pulse shapes and also good reproducibility require transducers with lens-shaped elemental blocks which, however, produce only weak signals. These transducers are significantly less sensitive in comparison to classical transducers. The same drawbacks have also been found for transducers which, because of special electrode configurations or inhomogeneous polarization of the piezo element, are capable of supplying relatively short signals.

OBJECT OF THE INVENTION

The object of the present invention is to provide a sound transducer for the ultrasonic range which can emit strong and short pulses, has a high sensitivity and can guarantee reproducibility of the parameters in serial production.

SUMMARY OF THE INVENTION

This object is achieved in accordance with the invention with a pulse sound transducer for the ultrasonic range for use either as a transmitter or as a receiver with an elementary block composed of piezoelectric material. In accordance with the invention, the height of the elementary block composed of piezoelectric material of the transducer is greater than its width and the block at the output end for the pulse has a shoulder so formed thereon that a smooth output surface is formed for the sound wave. The block in longitudinal sections has a T-shape, whereby the base polarization runs perpendicularly to the output surface and the one electrode is provided on the output surface while the other runs above the shoulder on the block.

The block which is T-shaped in longitudinal section, can have a column shape, cone shape or pyramid shape with round, oval or polygonal cross section and is so dimensioned that a damping of the waves is effected which move within the interior of the column so as to prevent a reflection within the interior of the column at the free column wall and thus the emission of an after oscillation which can result in deterioration of the pulse quality. As a result additional damping means can be avoided. In addition the production of the transducer as a mass produced article is greatly facilitated by eliminating the additional damping means and the adhesive connection thereto. Essential for the invention is the formation of shoulders on the block to form the elementary cell. This shaping of the block and the selected proportions and the arrangement of the electrodes, which are disposed on the output surface and around the block above the shoulder, are decisive for the base oscillation which is thus of three dimensional configuration.

It is also important that, as a consequence of the construction of the elementary cell in accordance with the invention, that the electric field is closed within the elementary cell and thus such that a stronger pulse can be sent out. The base polarization direction of the piezo material should be perpendicular to the foot surface and thus the output surface for the pulses of the T-shaped elementary cell.

It has been found that it is especially advantageous for the following dimensional ratio to be maintained, namely, a/b/h=1/4–6/10, where a is the thickness of the shoulder, b the diameter of the block or its width and h is the height of the elementary cell. The size ratio of the sound generating element, here the elementary cell, is of special significance for all sound wave generating construction as examples from the music world show. Thus the violin, the viola, the cello and the contrabass generate different highs and lows of tonality based upon their different size proportions. It has also been found that an additional radial polarization by the application of a high voltage can improve the strength of the pulses. The highest probability is that this polarization utilizes the additional piezo effect advantageously.

BRIEF DESCRIPTION OF THE DRAWING

Further details of the invention are explained on the basis of the accompanying drawing. In the drawing.

SPECIFIC DESCRIPTION

Figure 1:
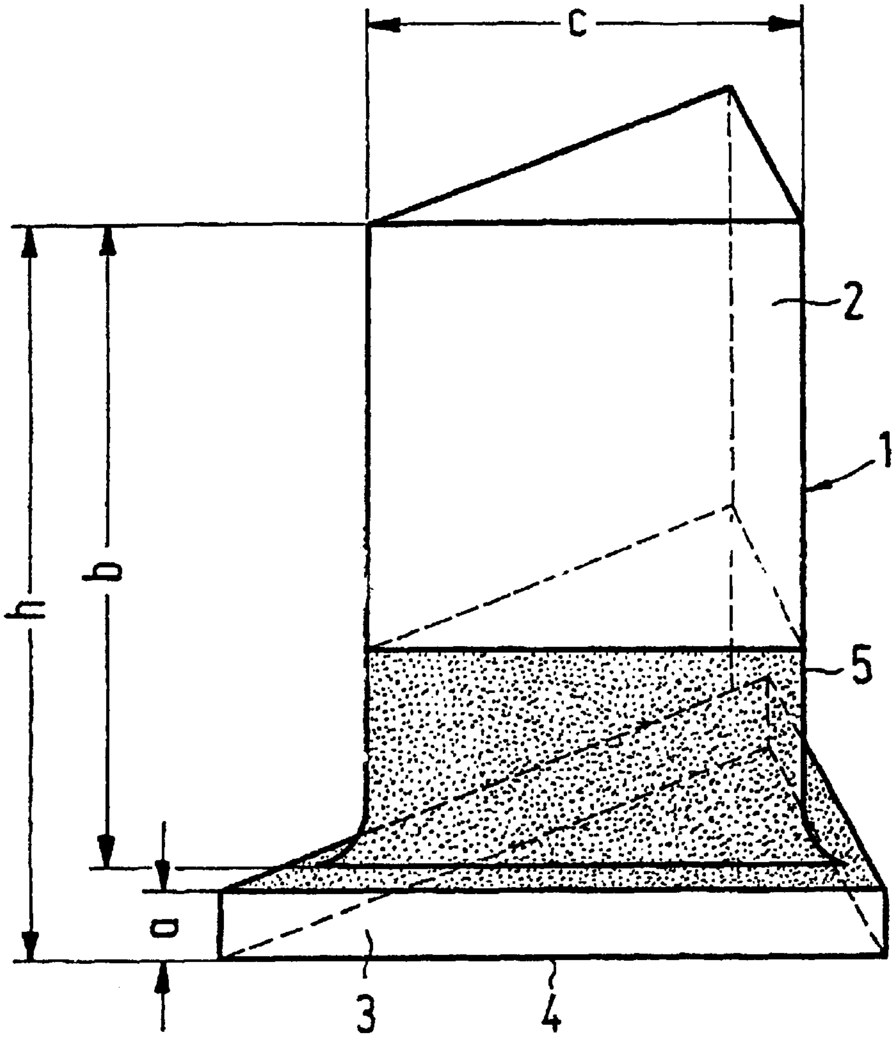
FIG. 1 is a perspective illustration of the elementary cell.

FIG. 1 shows the elementary cell in a perspective illustration. It is comprised of a block 2 and a shoulder 3 formed thereon. The shoulder projects outwardly beyond the block. In the illustrated configuration, the elementary cell 1 is of triangular shape in section and it can however also assume another shape. It can be round, oval and polygonal with the upwardly-turned tip running into a cone or pyramid. The one electrode 4 is arranged on the planar output surface for the pulses while the other electrode 5 extends laterally along the block 2. It is not required to have the electrode 5 extend around the entire block or that the lower electrode cover the entire lower surface.

Figure 2:
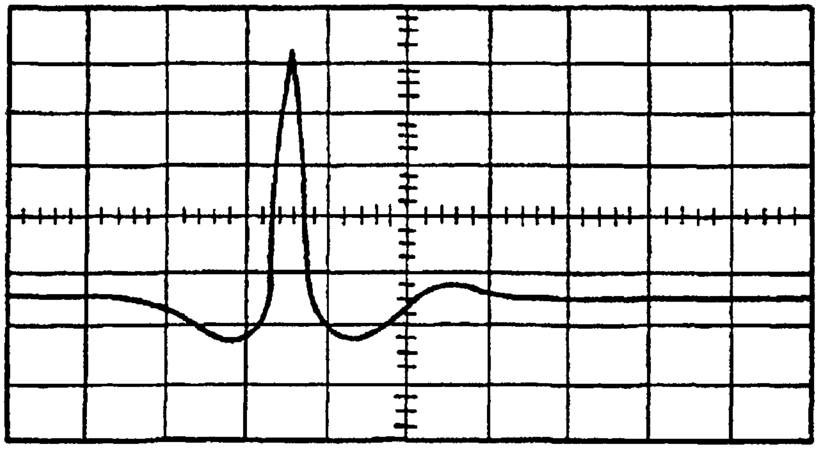
FIG. 2 is a graph of the shape of the pulse.

The thickness of the shoulder has been designated with a, the height of the block with b, the width of the block with c and the total height of the elementary cell with h. The active region of the elementary cell is found in the lower region of the block and within the shoulder. As has already been indicated, the proportions of the elementary cell are of essential significance. It has been shown that the thickness of the shoulder in proportion to the height of the block of piezo electric material to the total height, thus a/c/h should be held in the ratio 1/4–6/10 to produce optimal results. "Optimal results" means that strong and short pulses are emitted and the transducer has a high sensitivity. In FIG. 2 the pulse curve achieved with the sound transducer of the invention has been shown.

Figure 3:
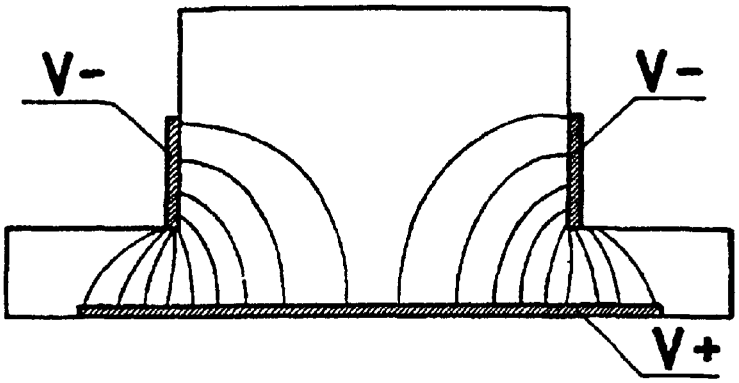
FIG. 3 is a diagram of the electric field within the elementary cell.

The T shape of the elementary cell 1 according to the invention is of very great significance since it enables enclosure of the electric field between the electrodes within the elementary cell. In FIG. 3 an image of the electric field in the elementary cell is reproduced. As can be seen from it, this electric field runs only within the elementary cell of the transducer. This shape enables, in addition, a volume oscillation and thus of waves which are directed upwardly (see FIG. 1) and thus so damps the surface travelling counter to the pulse output surface that they no longer can be reflected at the upper end of the elementary cell.

Of greater significance are the proportions of the elementary cells already indicated. The ratio of the individual parts of the elementary cell have already been given. The height of the cell h should be at least 10 times greater than the height of the shoulder a. The actual dimensions can, for example, have the following values: a=0.2 mm, c=1 mm and h=2 mm. Such a transducer produces pulses which are 20 ns long and has as a receiver, a band width of 4–35 MHz.

With the transducer according to the invention with the mentioned proportions, the ultrasonic surface which travel upwardly in the drawing are totally damped. The complete transducer must not be thicker than 2 mm. It is thus possible to make it significantly thinner when the elementary cell is so constructed that it forms a point tapered upwardly which particularly advantageously damps the waves travelling in this direction.

It is also significant that with the selected dimensional size proportions, the components of the electric field which are parallel to the foot of the elementary cell 1 and thus the transverse beam of the T are comparable with the components perpendicular thereto.

As a consequence of this fact, all piezo coefficients of the piezo material play a role of substantially the same significance. The result is a volume oscillation of the active region of the elementary cell which because of its shape and the targeted application of the electrodes gives rise to a supplemental polarization in the radial direction. The supplemental polarization, following fabrication of the transducer of the elementary cell results from the application of a relatively high voltage at its electrodes. This type of oscillation apparently enables a better utilization of the piezo effect and also influence the damping of the rearwardly traveling waves. The characteristics of the transducer according to the invention are thus determined only if the characteristics of the selected piezo electric material and the precision of the shape of the elementary cell, i.e. in other words the transducer according to the invention can be manufactured with a very good reproducibility. Transducers of this type can contain one or more elementary cells which can be connected together.

The transducer according to the invention is capable of producing very short and very strong pulses which cannot be achieved with other transducer construction. The amplitude of the produced pulse is at least twice as great as with classical transducers. Its sensitivity is comparable with classical constructions. The transducer according to the invention can be either produced with significantly lower cost and over all can be used wherever classical transducer types can be employed.

In summary it can be said that with the transducer according to the invention by comparison to other nonclassical construction, a significant increase in the effectivity can be achieved since no losses arise in the electric field externally and all undesired sound waves are subjected to a practically complete damping without the use of a large ceramic thickness or another damping body. By comparison to the classical constructions, the pulse length is shorter and the amplitude is greater. None of the known constructions can be fabricated more easily.

What is claimed is:

1. A pulse sound transducer for an ultrasonic range and capable of receiving or transmitting sound signals, consisting essentially of:

a block of piezoelectric material in the form of a single polygonal-section column having a shoulder individual to said column at one end thereof and forming a base, said shoulder having the same geometric configuration as said column and projecting uniformly outwardly perpendicular to each face of said column, said shoulder having a thickness a and a planar surface on a side of said shoulder opposite said column, said block having an overall height h and said column having a width c, said column and said shoulder forming a cell with all of its longitudinal cross sections being T-shaped and with base polarization perpendicular to said planar surface, the ratio of the thickness a to the width c to the overall height h being 1 to 4–6 to 10; and an electrode on said surface and another electrode on at least one of said faces of said column for electrical coupling to said block.

* * * * *